United States Patent [19]

Shou et al.

[11] Patent Number: 5,502,664

[45] Date of Patent: Mar. 26, 1996

[54] FILTER DEVICE INCLUDING SRAM AND EEPROM DEVICES

[75] Inventors: Guoliang Shou; Sunao Takatori; Makoto Yamamoto, all of Tokyo, Japan

[73] Assignee: Yozan Inc., Tokyo, Japan

[21] Appl. No.: 216,826

[22] Filed: Mar. 23, 1994

[30] Foreign Application Priority Data

Mar. 25, 1993 [JP] Japan .................................. 5-092450
Apr. 8, 1993 [JP] Japan .................................. 5-107738

[51] Int. Cl.⁶ ...................................... G06F 15/31
[52] U.S. Cl. ........................................ 364/724.16
[58] Field of Search ........................ 364/724.16, 724.01

[56] References Cited

U.S. PATENT DOCUMENTS

| | | | |
|---|---|---|---|
| 4,766,563 | 8/1988 | Fujimoto | 364/724.16 |
| 4,771,395 | 9/1988 | Watanabe et al. | 364/724.16 |
| 5,034,907 | 7/1991 | Johnson et al. | 364/724.16 |
| 5,163,154 | 11/1992 | Bournas et al. | 364/736 |
| 5,280,353 | 1/1994 | Baldwin | 364/724.16 |
| 5,365,466 | 11/1994 | Hazard | 364/717 |

OTHER PUBLICATIONS

Richard C. Dorf, "The Electrical Engineering Handbook", CRC PRESS Inc., 1993, pp. 674–691.

*Primary Examiner*—Tan V. Mai
*Attorney, Agent, or Firm*—Cushman, darby & Cushman

[57] ABSTRACT

A filter circuit switches a switching mechanism based on multiplier held in a data register DATA RGST as a digital data, based on the output data of data register DATA RGST, a multiplication circuit M is arranged to have weights corresponding to a capacity of capacitance connected with a common analog input voltage X.

4 Claims, 4 Drawing Sheets

FILTER DEVICE INCLUDING SRAM AND EEPROM DEVICES

FIELD OF THE INVENTION

The present invention relates to an adaptive filter device.

BACKGROUND OF THE INVENTION

In recent years, there are arguments concerning limitation of digital computers because of exponential increases in costs for equipment having increased speed. Analog computers are therefore drawing attention. On the other hand, stored conventional digital technology should be used and both workings of a digital data and an analog proteasings are necessary.

Recently, two types of circuits individually existed in the field of filter circuits: a circuit for treating analog data and a circuit for treating digital data.

In an analog circuit, there are thee advantages high speed processing time, small size by the fixed circuit and low price. On the other hand, there are advantages in a digital circuit resulting from their simple, modifiable design and their inherent accuracy. There are alto two disadvantages to digital circuits large size of the circuit and high price by increasing investments for equipment.

No filter circuit currently in existence exhibits the advantages of both the analog and a digital circuits while applying stored conventional digital technology.

Conventionally, to realize an adaptive filter, a programmable digital element such as DSP, etc, has been used, However, DSP is expensive and large size, so that a calculated result is fed back and multiple calculations are executed for a DSP. As a result, a filter with many taps cannot realize very high speed calculation. Also, a CPU was needed to control DSP rendering it difficult to reduce the size of the total circuit.

SUMMARY OF THE INVENTION

The present invention has an object to solve the conventional problems and has a purpose to provide a filter circuit achieving the advantages of both analog and digital circuits while applying stored conventional digital technology.

A filter device according to the present invention switches a switching mechanism using a data register holding a multiplier as a digital data and using an output data of the data register, arranges a multiplication circuit giving a weight corresponding to a capacity of a capacitance connected with a common analog input voltage.

PREFERRED EMBODIMENT OF THE PRESENT INVENTION

Hereinafter an embodiment according to the present invention is described referring to the attached drawings.

Figure 1:
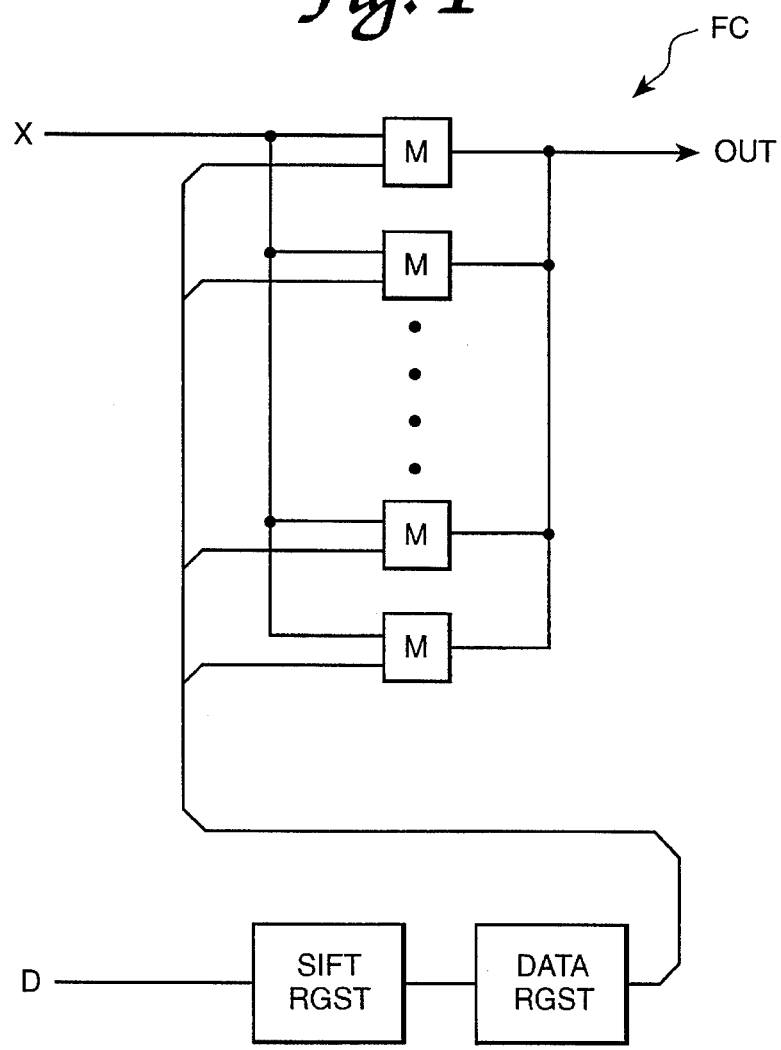
FIG. 1 is a circuit diagram showing the first embodiment of a filter device according to the present invention.
Figure 5:
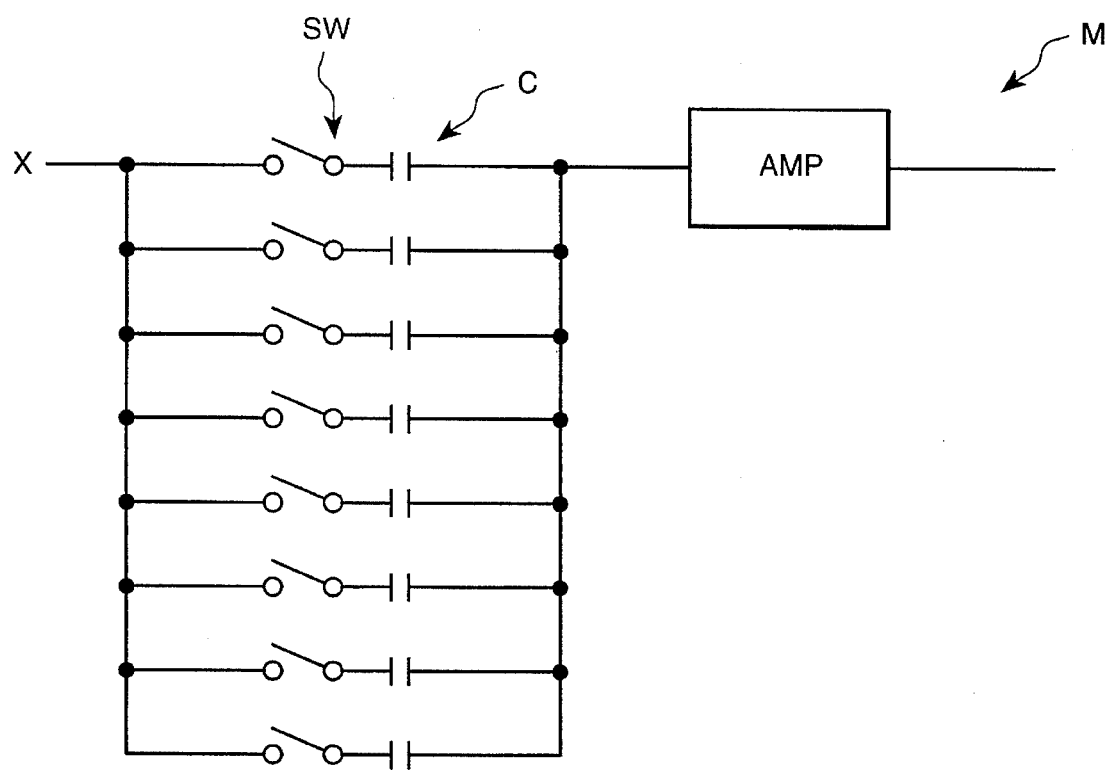
FIG. 5 is a multiplier with an amplifiers for compensating voltage level.

In FIGS. 1 and 5, a filter circuit FC includes a filter device that comprises multiple multiplication circuits M which are connected in parallel and a data register DATA RGST which is conned comprises multiple multiplication circuits M which are connected in parallel and a data register DATA RGST which is connected with these multiplication circuits M through a bus. A shift register SIFT RGST is serially connected with the data register DATA RGST. In the filter circuit FC, an analog input voltage X and a digital input voltage D are input.

The multiplication circuit performs multiplication of an analog input voltage X with weights corresponding to a capacity of a capacitance. An output of the digital data from a data register DATA RGST switches switching means SW and selects capacitances C for connecting to the analog input voltage X (see FIG. 5). The output of capacitances is compensated by an amplifier AMP.

Analog input voltage X is input in parallel to a capacitive coupling composed of capacitances connected with switching means.

Digital data output from data register DATA RGST is held as a multiplier of the present filter circuit SRAM is used as a holding means for the digital data at the data register. Therefore, it is easy to delete and write a multiplier value in a high speed.

Figure 2:
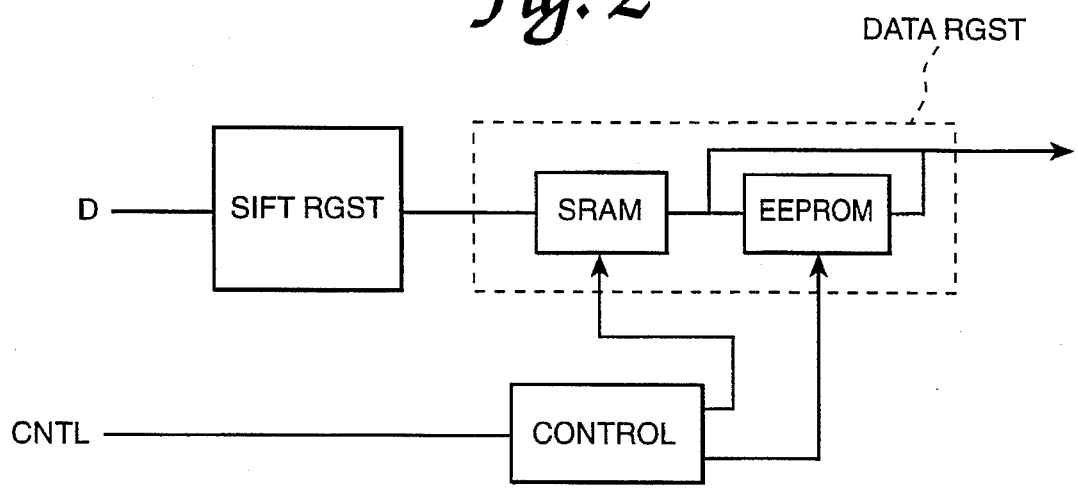
FIG. 2 is a block diagram of data register, shift register and control means of the first embodiment.

On the other hand, as shown in FIG. 2, the data register may be provided with a non-volatile EEPROM. This circuit is useful for fixed multipliers such as an audio circuit without CPU and system memory, Data register output data stored in holding means SRAM and digital data held by EEPROM as a multiplier of a filter circuit.

At data holding means SRAM and EEPROM of data register, control signal CNTL is input from control means CONTROL and data of SRAM is transferred to EEPROM.

When data register receives input, there is provided a shift register paralyzing serial one-bit digital data input in the inside. As a result, all multipliers from a pin are input by a serial data form, and it is effective to be compactness of LSI because of decreasing number of pins of an accumulated circuit.

As mentioned above, a filter circuit processing an analog data and a digital in data is digital form. Thus a periphery circuit such as a data register, can effectively use and hold digital data with high accuracy for a long time.

Hereinafter, an embodiment according to the present invention is described with reference to attached FIG. 3 of the drawings.

Figure 3:
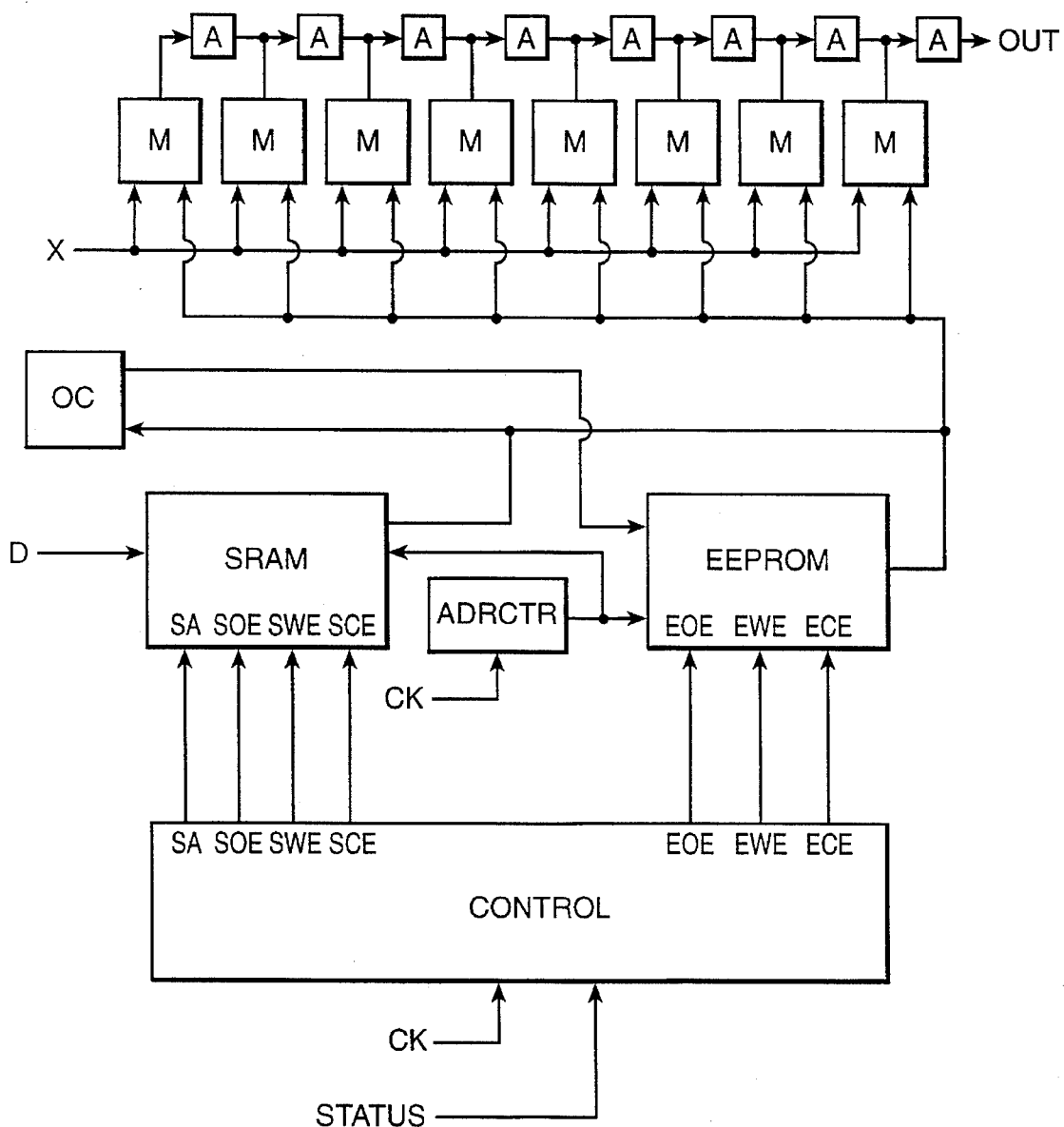
FIG. 3 is a block diagram showing the second embodiment of a filter device according to the present invention.

In FIG. 3, a filter device is composed of a plurality of multipliers M, and adder A, memory SRAM, address counter ADRCTR, non-volatile memory EEPROM and control means CONTROL.

SRAM and EEPROM are connected with a parallelly of connected multiplier. SRAM and EEPROM are connected by an out circuit OC, a control means and an address counter.

The filter device sequential ly multiplies according to the predetermined multiplier corresponding to an input data X. The multiplier is input to SRAM as digital data D. The input digital data to SRAM is held after being writing into an address of SRAM, and it is output in a multiplier M as a multiplier. The plurality of multipliers are connected in parallel. They realize high speed as a special hardware.

All digital data D written in the SRAM is held after being written in an address corresponding to EEPROM by optimal control means. Then, it is output to the multipliers M as a multiplier.

The present invention is an adaptive filter device capable to use for both SRAM and EEPROM.

This device is useful for an unfixed multiplier which uses SRAM as an independent device. Additionally it is useful for a fixed multiplier such as audio circuit without CPU and system memory which uses EEPROM as an independent device.

In order to write data stored in SRAM into EEPROM, rather high voltage is needed, so an out circuit OC from SRAM connected with EEPROM is used as a boosting circuit. When the boosting circuit is involved in the LSI operation, it is necessary to make withstand voltage of all circuits within the LSI high. This leads to increased cost.

Addresses within SRAM and EEPROM are counted using an address counter APRCTR.

Clock CK is input at the address counter ADRCTR, and at the control means CONTROL.

At the control means, information (status) concerning a condition of pheripheral device of SRAM and EEPROM is input. Control means CTRL controls enable (SWE), out enable (SOE), address (SA), chip enable (SCE), write enable (EWE), chip enable (ECE) of EEPROM.

Figure 4:
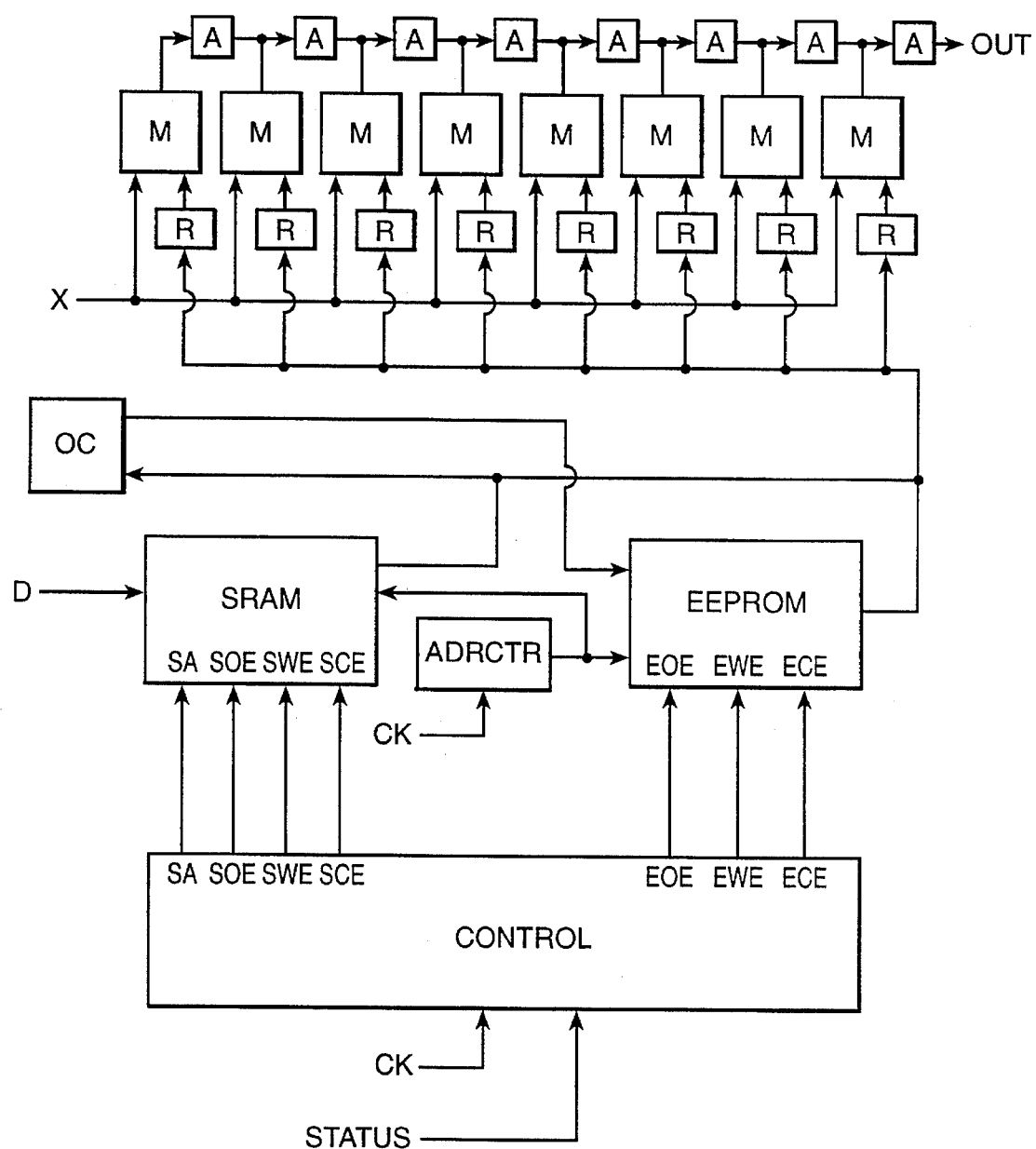
FIG. 4 is a block diagram showing the third embodiment of a filter device according to the present invention.

FIG. 4 is a block diagram of a circuit with a plurality of registers R for storing multipliers. These registers are each arranged adjacent to corresponding multiplier M, By arranging each register R adjacent to a corresponding multiplier M, the length of a line from each register to an amplifier is shortened and an accuracy of data increases while noise for other circuits decreases.

The filter device according to the present invention switches a switching means based on a multiplier held in a data register as a digital data. Based on the output data of the data register, a multiplication circuit is arranged to have weights corresponding to a capacity of capacitance connected with a common analog input voltage. A filter circuit is therefore provided having the advantages of both an analog and a digital circuit while applying stored conventional digital technology, Furthermore, the filter device according to the present invention realizes high speed processing as a special hardware by parallelly connecting a plurality of multipliers using EEPROM as a means for holding corresponding multiplier values. The device can be used independently, so that it may operate as a high speed, independent device in spite of an adaptive filter.

What is claimed is:

1. A filter device comprising:
   a SRAM for storing a plurality of predetermined multiplier values, said SRAM having a plurality of addresses;
   an EEPROM connected to said SRAM, said EEPROM having addresses which correspond to said addresses of said SRAM;
   a plurality of multipliers connected in parallel for multiplying an input data by one of said plurality of predetermined multiplier values from one of said SRAM and said EEPROM;
   a control circuit for reading one of said predetermined multiplier values stored in said SRAM and for writing said read multiplier value in said EEPROM at an address corresponding to an address of said read multiplier value stored in said SRAM so that said multipliers remain stored in said SRAM while being changed, said multipliers being transferred to said EEPROM after becoming settled; and
   means for generating an output signal based on output from said multipliers.

2. A filter device comprising:
   a SRAM for storing a plurality of predetermined multiplier values, said SRAM having a plurality of addresses;
   an EEPROM connected to said SRAM, said EEPROM having addresses which correspond to said addresses of said SRAM;
   a plurality of registers for storing one of said predetermined multiplier values from one of said SRAM and said EEPROM;
   a plurality of multipliers respectively corresponding to said registers and being connected in parallel for multiplying an input data by one of said multiplier values;
   a control circuit for selectively reading one of said predetermined multiplier values stored in said SRAM and for writing said read multiplier value in said EEPROM at an address corresponding to an address of said read multiplier value stored in said SRAM; and
   means for generating an output signal based on output from said multipliers.

3. A filter device as claimed in claim 2, wherein each of said registers is arranged in a periphery of each corresponding multiplier.

4. A filter device as claimed in claim 1, 2 or 3, further comprising a boosting circuit for said EEPROM.

* * * * *

UNITED STATES PATENT AND TRADEMARK OFFICE
CERTIFICATE OF CORRECTION

PATENT NO.   : 5,502,664
DATED        : Mar. 26, 1996
INVENTOR(S)  : SHOU et al.

It is certified that error appears in the above-identified patent and that said Letters Patent is hereby corrected as shown below:

ON THE COVER PAGE:
Reads:

[73]   Assignee:   Yozan Inc., Tokyo, Japan

Should Read:

[73]   Assignee:   Yozan Inc., Tokyo Japan
                            Sharp Corporation, Osaka, Japan Signed and Sealed this Second Day of July, 1996

Attest:

BRUCE LEHMAN

*Attesting Officer*     *Commissioner of Patents and Trademarks*